United States Patent [19]
De Jong

[11] Patent Number: 6,104,245
[45] Date of Patent: Aug. 15, 2000

[54] MEASURING AMPLIFIER

[75] Inventor: Paulus C De Jong, Zenenhoven, Netherlands

[73] Assignee: Stichting voor de Technische Wetenschappen, Utrecht, Netherlands

[21] Appl. No.: 09/155,360

[22] PCT Filed: Mar. 24, 1997

[86] PCT No.: PCT/NL97/00148

§ 371 Date: Dec. 10, 1998

§ 102(e) Date: Dec. 10, 1998

[87] PCT Pub. No.: WO97/36371

PCT Pub. Date: Oct. 2, 1997

[30] Foreign Application Priority Data

Mar. 28, 1996 [NL] Netherlands ............................ 1002732

[51] Int. Cl.$^7$ .................................................. H03G 3/12
[52] U.S. Cl. .............................................. 330/282; 330/86
[58] Field of Search ................................ 330/86, 282, 284

[56] References Cited

U.S. PATENT DOCUMENTS

| | | | |
|---|---|---|---|
| 4,024,346 | 5/1977 | McDermott | 330/284 |
| 4,132,957 | 1/1979 | Hekimian et al. | |
| 4,206,415 | 6/1980 | Boudouris et al. | 330/284 |
| 4,558,239 | 12/1985 | Kim et al. | 330/284 |
| 4,695,806 | 9/1987 | Barrett | 330/284 |
| 5,233,309 | 8/1993 | Spitalny et al. | 330/284 |

FOREIGN PATENT DOCUMENTS 0190974  8/1986  European Pat. Off. .

OTHER PUBLICATIONS

Meijer, G.C.M., et al., "New Concepts for Smart Signal Processors and Their Application to PSD Displacement Transducers", Sensors and Actuators, vol. A35, No. 1, Oct. 1, 1992, pp. 23–30.

"Accurate Gain Switching", Electronics World and Wireless World, vol. 97, No. 1674, May 1, 1992, p. 25.

Primary Examiner—Robert Pascal
Assistant Examiner—Henry Choe
Attorney, Agent, or Firm—Jeffrey D. Myers; Joseph Barrera

[57] ABSTRACT

An instrumentation amplifier for absolute voltage amplification having a balanced voltage inlet and a balanced voltage outlet. The voltage inlet is coupled to first amplification units having a very high open-loop gain, and which is further coupled with a feedback network provided between the outputs and second inputs of the amplification units.

6 Claims, 1 Drawing Sheet

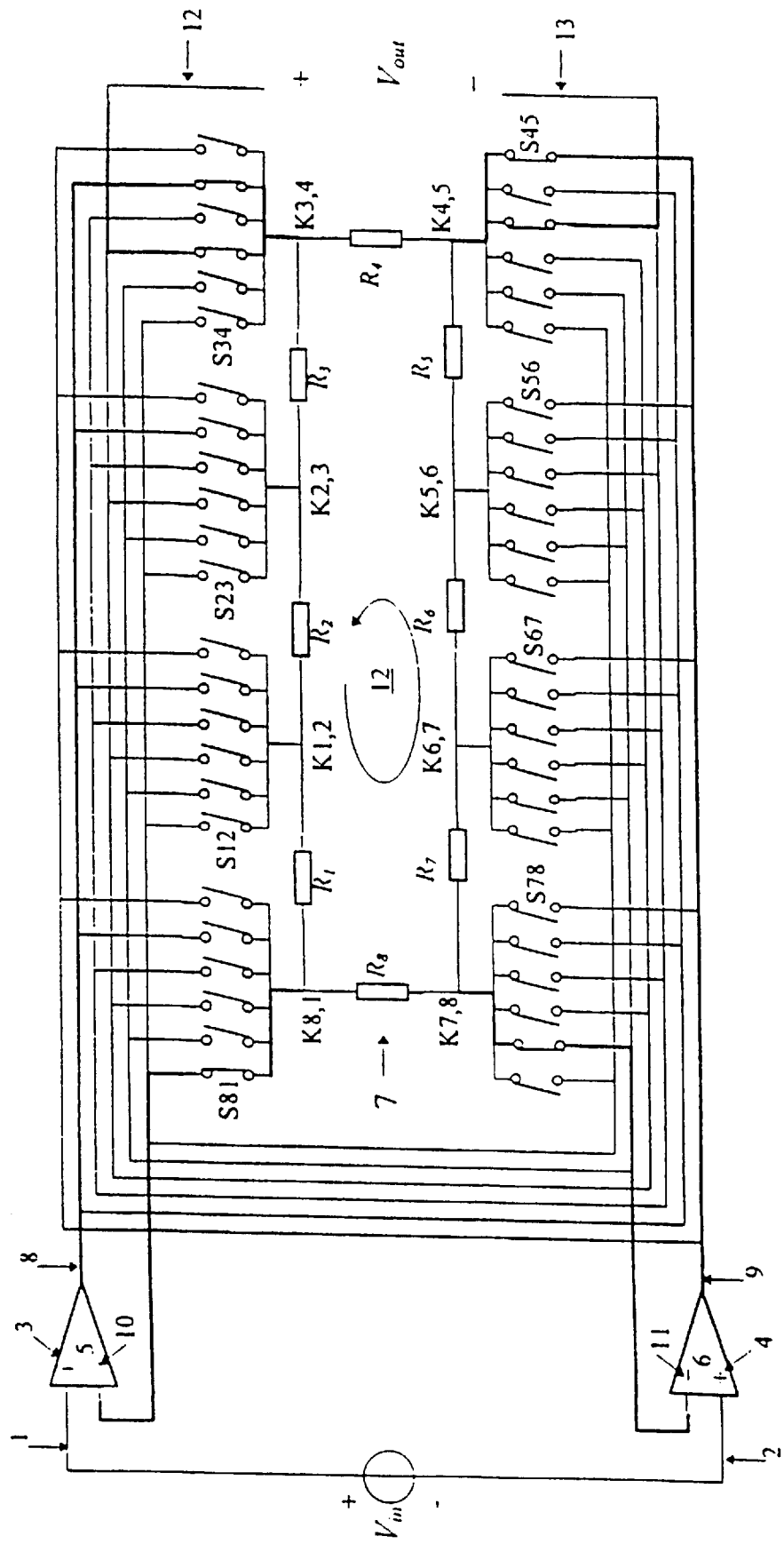

MEASURING AMPLIFIER

FIELD OF THE INVENTION

The invention relates to an instrumentation amplifier for absolute voltage amplification having a balanced voltage inlet and a balanced voltage outlet, wherein the voltage inlet is coupled with the first inputs of amplification units having a very high open-loop gain, and which is further coupled with a feedback network provided between the outputs and second inputs of the amplification units.

BACKGROUND OF THE INVENTION

An instrumentation amplifier of this kind is known in practice and is used as measuring amplifier for sensors with which process data are measured such as, for instance, pressure, temperature or current strength. A known application is the application of the instrumentation amplifier in the oil industry, where during drilling measuring equipment is inserted in the drill shank and both the measuring instruments and the instrumentation amplifier are exposed to high temperatures. Said temperatures may range from 175–250° C. Under such conditions much is demanded from the specifications and the stability of said specifications of the instrumentation amplifier and consequently from the components incorporated therein. A problem is created by the circumstance that differences in drift between the components of the instrumentation amplifier result in precision and calibration problems; there is another awkward circumstance with the above-mentioned application namely, that it is impossible to carry out maintenance on an instrumentation amplifier inside a drill shank. If such an instrumentation amplifier unexpectedly exhibits problems, the costs involved in replacing it are excessively high in relation to the cost of such an instrumentation amplifier.

SUMMARY OF THE INVENTION

It is therefore the object of the invention to provide an instrumentation amplifier giving a precise voltage amplification at any operating temperature without the need for calibration, wherein the drift of the components occurring in practice has a very greatly reduced effect on the precision and stability of the instrumentation amplifier.

To this end the instrumentation amplifier according to the invention is characterized, in that the feedback network comprises substantially equivalent components, each of which during a measuring cycle cyclically occupies all places in the feedback network by means of selective control of the switches which are electrically coupled with the components, and that the components of the feed-back network thereby form a switch-free current loop. By cyclically exchanging the substantially equivalent components, the instrumentation amplifier according to the invention is provided with an average amplification which depends substantially on the number of components used in the feedback network. In this manner relative insensitivity is obtained with regard to the nominal value pertaining to each separate component, that is to say that the nominal values are very much less sensitive to deviations and are of limited significance for the precision of the amplification provided by means of the instrumentation amplifier. Also, drift of the components has only a very limited influence. The fact that the components of the feedback network thus form a switch-free current loop ensures that the additional resistance caused by such switches has no influence on the precision of the instrumentation amplifier.

In a particular aspect according to the invention the instrumentation amplifier is characterized in that at each nodal point between two directly electrically coupled components six switches are connected, at least one of which is always closed during the measuring cycle, and which switches serve to selectively couple each nodal point separately and in succession with one of the two second inputs of the amplification units, with one of the two outputs of the amplification units, and with a line of the voltage outlet such that with regard to all the nodal points a coupling exists wherein the coupling between the nodal points is non-short-circuiting.

This manner provides a simple method of allowing all components to occupy all desirable places in the feedback network. It is desirable that during a measuring cycle every nodal point is coupled for a limited time with one of the two second inputs of the amplification units, with the other of the two second inputs of the amplification units, with one of the two outputs of the amplification units and with the other of the two outputs of the amplification units.

In a particular aspect according to the invention the instrumentation amplifier is characterized in that with regard to each component, the provision is made that during a measuring cycle the two nodal points on either side of a component from the switch-free current loop are always coupled with the two respective outputs of the amplification units by means of selective control of the switches. This component coupled with the two outputs of the amplification units then forms the load for the two measuring amplifiers over which the output voltage, representing the precisely amplified input voltage, has to be determined.

In connection herewith and according to the invention, the two nodal points on either side of the components, which during the measuring cycle are coupled with the two respective outputs of the amplification units, are at the same time coupled by means of selective switch control with the two respective lines of the balanced voltage outlet.

BRIEF DESCRIPTION OF THE DRAWING

The FIGURE is a schematic circuit diagram of the present invention.

DETAILED DESCRIPTION OF THE PREFERRED EMBODIMENT

The invention will now be further elucidated with reference to the drawing of a single FIGURE representing an instrumentation amplifier according to the invention.

The FIGURE shows a diagram of an instrumentation amplifier according to the invention having a voltage inlet with lines 1 and 2 to which a voltage source $V_{in}$ can be connected. The voltage inlet 1,2 is coupled with the positive first inputs 3,4 of amplification units 5,6 which possess a very high open-loop gain. The desired closed-loop gain of the instrumentation amplifier is afforded by means of a feedback network 7, which is provided between the outputs 8,9 and the negative inputs 10,11 of the amplification units 5,6. In the present embodiment the feedback network 7 comprises eight substantially equal resistances $R_1$ to $R_8$. Said resistances are connected such that between an output 8,9 and an input 10,11 of the voltage amplifiers 5,6, seven resistances are connected, with the eighth resistance being coupled between the two negative inputs 10,11 of the voltage amplifiers 5,6. With this configuration the resulting average amplification is seven. Other amplification factors can be simply obtained by varying the number of resistances of the feedback network 7. To achieve the object in accordance with the invention it is important that the components $R_1$ to $R_8$ are substantially equivalent while, as a result of using the circuit according to the invention, for one thing the sensitivity to deviation, with respect to said equivalence is greatly reduced. In this manner the precision of the instrumentation amplifier is promoted and the necessity for repeated calibration to combat drift effects is reduced.

To achieve this objective according to the invention, each of the components $R_1$ to $R_8$ has to occupy every one of the possible positions in the feedback network 7 during a measuring cycle, which according to the invention is realized through cyclically and selectively controlling switches coupled electrically with the components $R_1$ to $R_8$, while, however, the components $R_1$ to $R_8$ of the feedback network 7 continuously form a switch-free current loop 12. To this purpose each nodal point $K_{1,2}$, $K_{2,3}$, $K_{3,4}$, $K_{4,5}$, $K_{5,6}$, $K_{6,7}$, $K_{7,8}$, $K_{8,1}$ is provided with clusters of six switches $S_{81}$, $S_{12}$, $S_{23}$, $S_{34}$, $S_{45}$, $S_{56}$, $S_{67}$, $S_{78}$, coupled with said nodal points while during operation at least one switch of each cluster of switches is closed, and said switches serve to couple each of said nodal points with one of the two inputs 10,11 of the amplification units 5,6, with one of the two outputs 8,9 of the amplification units 5,6 and with a line 12,13 of the voltage outlet $V_{out}$. Each of the nodal points is connected with another point, such that all possible connections are made and the nodal points do not inter-short-circuit.

According to the invention, during a measuring cycle in which $V_{in}$ is amplified to the value $V_{out}$, each nodal point $K_{1,2}$, $K_{2,3}$, $K_{3,4}$, $K_{4,5}$, $K_{5,6}$, $K_{6,7}$, $K_{7,8}$, $K_{8,1}$ has to be coupled for a limited time with one of the two second inputs 10,11 of the amplification units 5,6 respectively with the other of the two second inputs 10,11 of said amplification units, with one of the two outputs 8,9 of the amplification units 5,6 and with the other 9,8 of the two outputs of the amplification units.

In the illustrated frozen situation of a particular circuit during a measuring cycle, the component $R_4$, or rather the nodal points 3,4 and 4,5 at either side of said component $R_4$ are, by means of selective control of switches from the clusters of switches $S_{34}$ and $S_{45}$, coupled with said nodal points, coupled with the respective outputs 8,9 of the amplification units 5,6 and at the same time said nodal points $K_{3,4}$ and $K_{4,5}$ are coupled with the two lines 12,13 of the voltage outlet $V_{out}$ by means of selective control of other switches from the clusters of switches $S_{34}$ and $S_{45}$. It is for instance possible to connect to $V_{out}$ a high-ohmic voltmeter for the (virtually) current-less measuring of the voltage falling over the component $R_4$, allowing precise measurement without any disturbance caused by the influence of the resistances formed by the respective switches. This is especially important in the usual embodiment of such a circuit consisting partly of operational amplifiers and partly of resistances and switches. This standard embodiment employs switches in the form of MOS-transistors having a significant voltage-dependent resistance. With the circuit according to the invention the influence of this voltage-dependency is eliminated.

The cyclic and selective control of the switches $S_{81}$, $S_{12}$, $S_{23}$, $S_{34}$, $S_{45}$, $S_{56}$, $S_{67}$, $S_{78}$ makes that the resistances $R_1$ to $R_8$ continually exchange places so that the resistance values, which determine the amplification of the instrumentation amplifier, are levelled out. With substantially equivalent components $R_1$ to $R_8$ this provides a very precise voltage amplification while the sensitivity for drift is greatly reduced. The speed with which the switches connecting the nodal points between the components $R_1$ to $R_8$ with the inputs and outputs of the operational amplifiers or with the lines which connect with the voltage outlet of the instrumentation amplifier, is mainly determined by the noise characteristic of the components $R_1$ tot $R_8$ that are employed. The higher the frequency of the 1/f noise characteristic of said components, the higher the control frequency of the switches has to be adjusted. According to the invention, drift of the components $R_1$ to $R_8$ having a turnover frequency higher than the control frequency is compensated albeit to a lesser degree.

With the instrumentation amplifier according to the invention an amplification can be realized with a precision better than 10 ppm.

What is claimed is:

1. An instrumentation amplifier for absolute voltage amplification having a balanced voltage inlet and a balanced voltage outlet, wherein the voltage inlet is coupled with the first inputs of amplification units having a very high open-loop gain, and which is further coupled with a feedback network provided between outputs and second inputs of the amplification units, characterized in that the feedback network comprises substantially equivalent components, each of which during a measuring cycle cyclically occupies all places in the feedback network by means of selective control of switches which are electrically coupled with the components, and that the components thereby form a continuous switch-free current loop.

2. An instrumentation amplifier according to claim 1, characterized in that at each nodal point between two directly electrically coupled components, six switches are connected, at least one of which is always closed during the measuring cycle, and which switches serve to selectively couple each nodal point separately and in succession with one of the two second inputs of the amplification units with one of the two outputs of the amplification units, and with a line of the voltage outlet such that with regard to all the nodal points a coupling exists wherein the coupling between the nodal points is non-short-circuiting.

3. An instrumentation amplifier according to claim 1, characterized in that during a measuring cycle every nodal point is coupled for a limited time with one of the two second inputs of the amplification units, with the other of the two second inputs of the amplification units, with one of the two outputs of the amplification units and with the other of the two outputs of the amplification units.

4. An instrumentation amplifier according to claim 1, characterized in that with regard to each component, the provision is made that during a measuring cycle the two nodal points on either side of a component from the switch-free current loop are always coupled with the two respective outputs of the amplification units by means of selective control of the switches.

5. An instrumentation amplifier according to claim 4, characterized in that the two nodal points on either side of the components, which during the measuring cycle are coupled with the two respective outputs of the amplification units, are at the same time coupled by means of selective switch control with the two respective lines of the balanced voltage outlet.

6. An instrumentation amplifier according to claim 1, characterized in that the switches during operation have a control frequency which causes said switches to open or close respectively, and which is higher than a turn-over frequency according to the 1/f noise characteristic of the components.

\* \* \* \* \*